United States Patent
Shih et al.

(10) Patent No.: US 6,361,704 B1
(45) Date of Patent: Mar. 26, 2002

(54) SELF STOP ALUMINUM PAD FOR COPPER PROCESS

(75) Inventors: Tsu Shih; Chen-Hua Yu, both of Hsin-Chu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/570,019

(22) Filed: May 12, 2000

(51) Int. Cl.[7] .......... B44C 1/22; H01L 21/302; G03C 5/00; C23C 14/34

(52) U.S. Cl. .......... 216/38; 438/692; 430/314; 204/192.17

(58) Field of Search .......... 204/192.15, 192.17; 216/38; 438/692; 430/314

(56) References Cited

U.S. PATENT DOCUMENTS

| | | | | |
|---|---|---|---|---|
| 4,719,154 A | * | 1/1988 | Hatwar .......... | 428/694 |
| 5,178,739 A | * | 1/1993 | Barnes et al. .......... | 204/192.12 |
| 5,607,718 A | * | 3/1997 | Sasaki et al. .......... | 427/97 |
| 5,663,086 A | | 9/1997 | Rostoker et al. .......... | 438/210 |
| 5,696,406 A | | 12/1997 | Ueno .......... | 257/784 |
| 5,785,236 A | | 7/1998 | Cheung et al. .......... | 228/180.5 |
| 5,939,790 A | | 8/1999 | Gregoire et al. .......... | 257/773 |

OTHER PUBLICATIONS

Murarka et al., (1995) "Copper Metallization for ULSI and Beyond", Critical Reviews in Solid State and Materials Science, pp. 87–93, 119, 120.*

* cited by examiner

Primary Examiner—Nam Nguyen
Assistant Examiner—Steven H. VerSteeg
(74) Attorney, Agent, or Firm—George O. Saile; Stephen B. Ackerman

(57) ABSTRACT

A new method is provided to create aluminum pads that overlay an electrical contact point. A thick layer of passivation is deposited over the surface that contains one or more electrical contact points, the layer of passivation is patterned thereby creating openings in the layer of passivation that overlay and align with one or more of the contact points. A layer of aluminum is sputter deposited over the passivation layer including the openings that has been created in the passivation layer, this layer of aluminum is sputtered to a thickness such that the surface of the aluminum that is created in the openings in the layer of passivation is lower than the surface of the layer of passivation. The deposited layer of aluminum is polished using methods of CMP whereby the polishing end point is the surface of the layer of passivation. The surface of the aluminum that has been deposited inside the openings that have been created in the passivation layer is not affected by this polishing operation and therefore maintains its characteristics that have been established during the deposition of the layer of aluminum. This surface therefore is not affected by any chemical processes of etching and wet stripping and therefore contains its original and desirable bond and adhesion qualities.

10 Claims, 5 Drawing Sheets

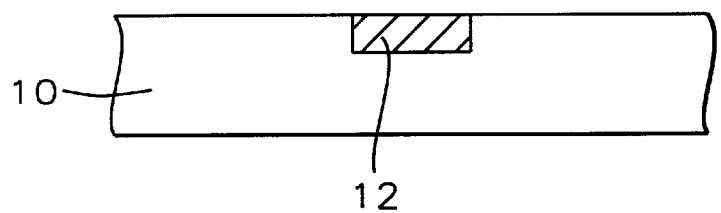
FIG. 1a – Prior Art
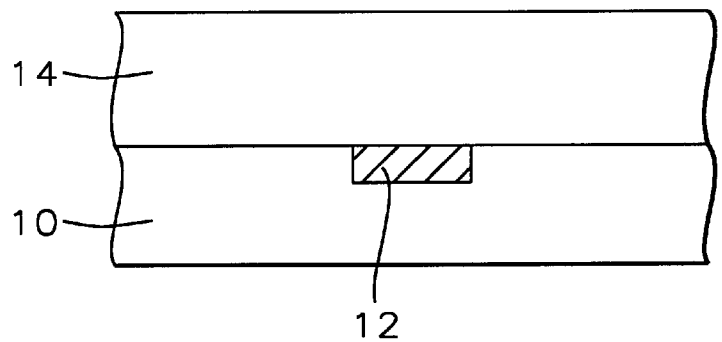
FIG. 1b – Prior Art
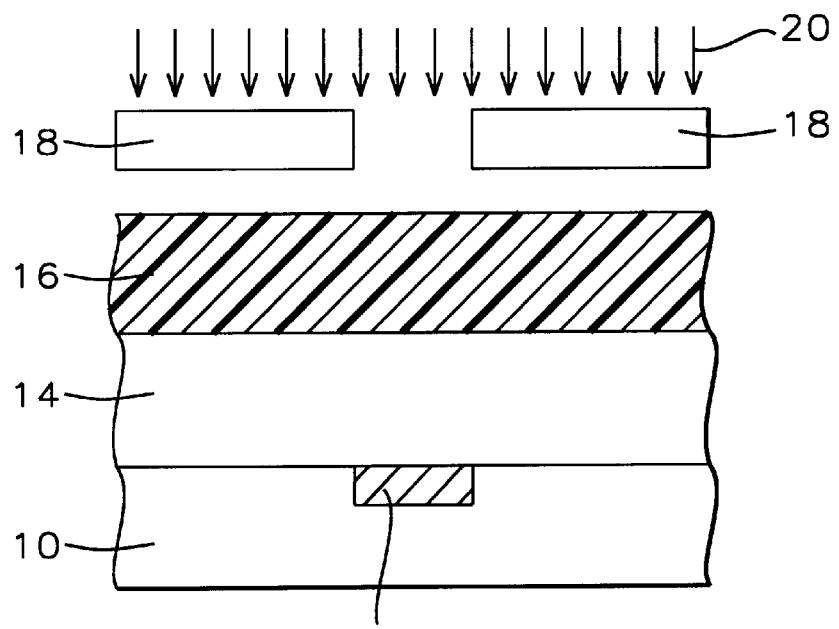
FIG. 1c – Prior Art

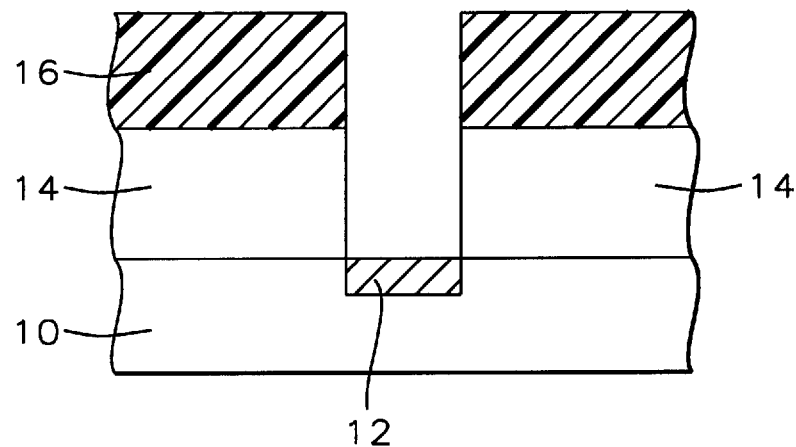
FIG. 1d - Prior Art
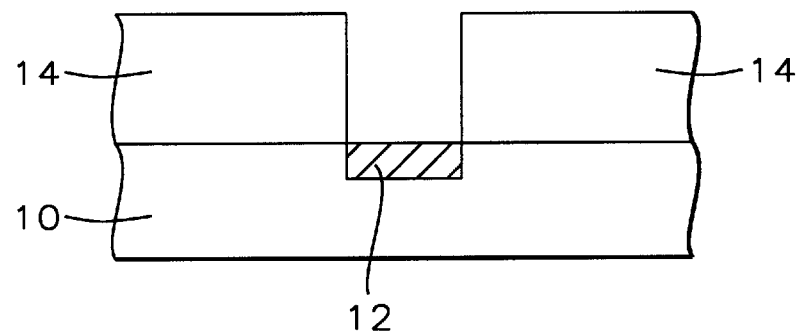
FIG. 1e - Prior Art
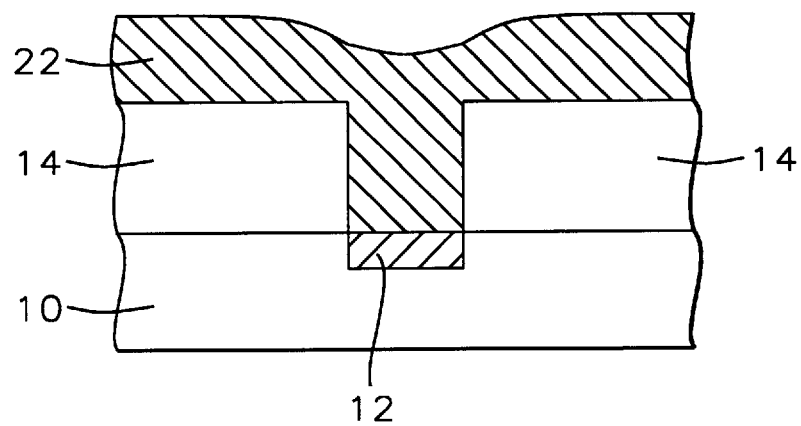
FIG. 1f - Prior Art

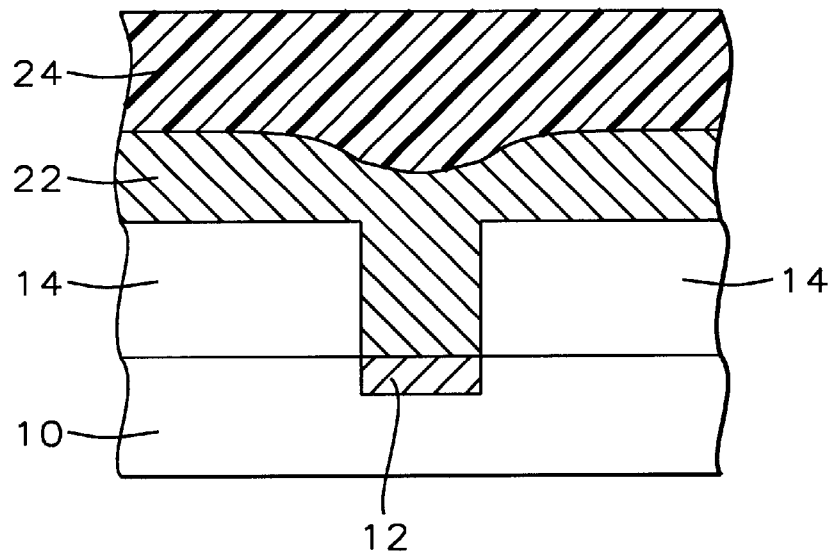
FIG. 1g – Prior Art
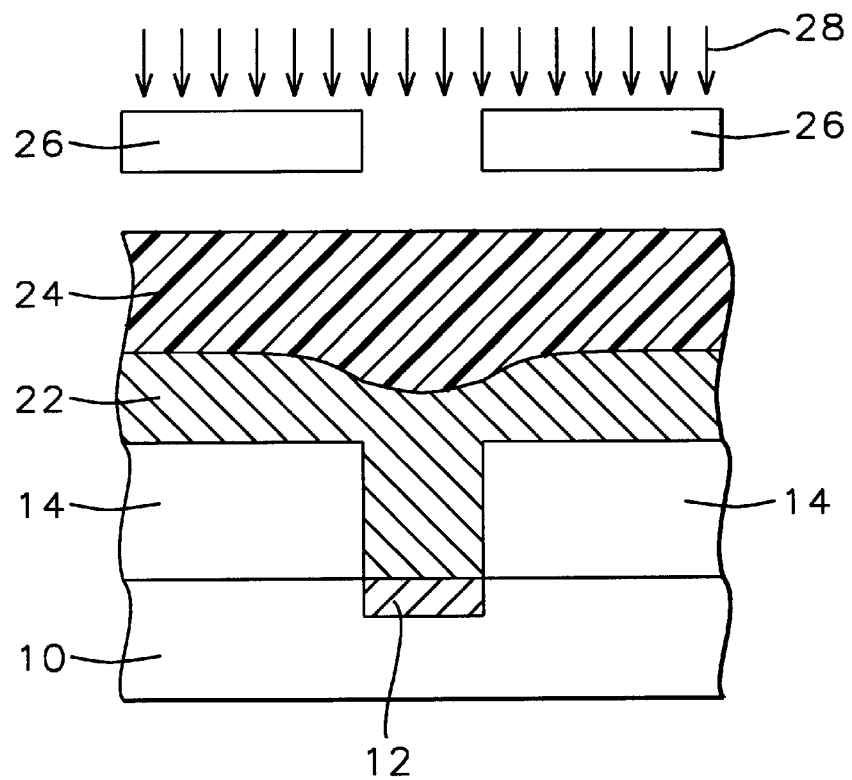
FIG. 1h – Prior Art

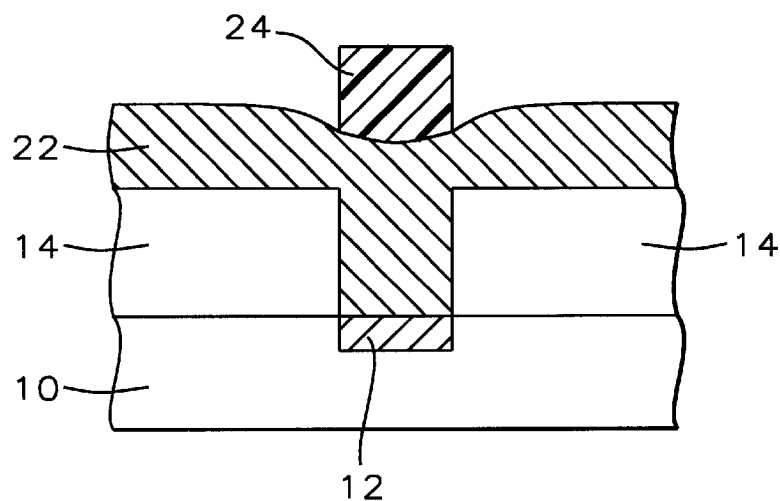
FIG. 1j – Prior Art
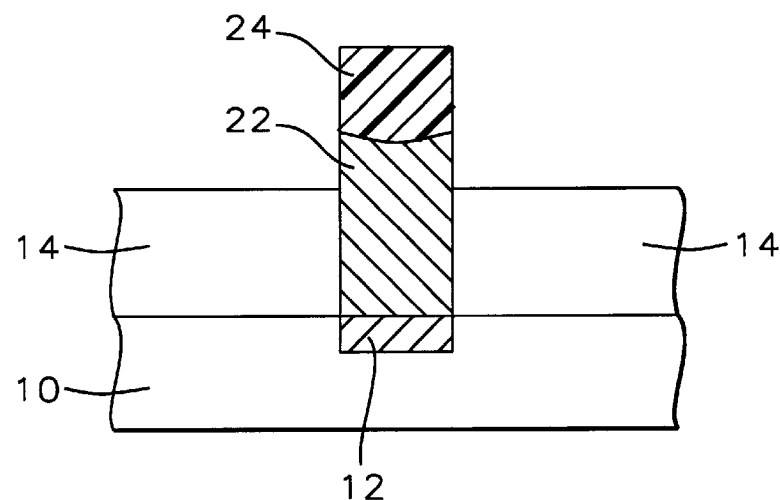
FIG. 1k – Prior Art
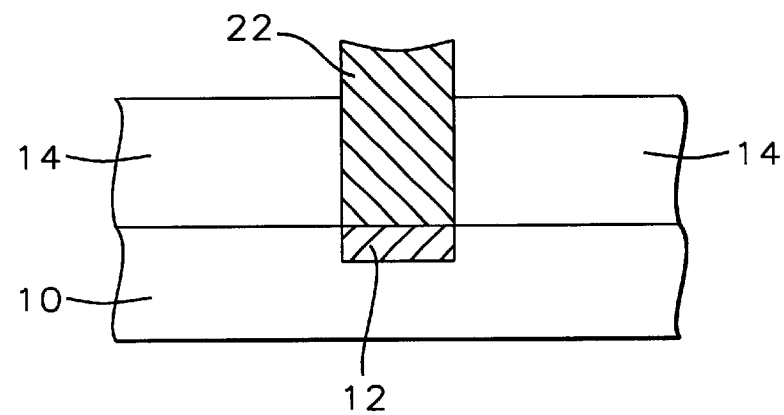
FIG. 1m – Prior Art

SELF STOP ALUMINUM PAD FOR COPPER PROCESS

BACKGROUND OF THE INVENTION (1) Field of the Invention

The invention relates to the fabrication of integrated circuit devices, and more particularly, to a method to provide an aluminum pad that covers exposed copper and thereby protect the copper against oxidation.

(2) Description of the Prior Art

This invention relates to the creation of pad structures that are used for integrated circuits. This invention more particularly relates to structures that allow multiple via holes to be used such that they can provide electrical contacts between overlying layers of metal interconnects within a semiconductor device.

In creating semiconductor devices, the technology of interconnecting devices and device features is of great importance. Bond pads are frequently used for this purpose, it is a requirement in creating semiconductor devices that bond pads can be produced that are simple, reliable and inexpensive.

Bond pads are generally used to wire device elements and to provide exposed contact regions of the die, these contact regions are suitable for wiring the die to components that are external to the die. An example is where a bond wire is attached to the bond pad of a semiconductor die at one end and to a portion of a Printed Circuit Board at the other end of the wire. The art is constantly striving to achieve improvements to the creation of bond pads that simplify the manufacturing process while enhancing bond pad reliability.

A frequently used bond pad consists of an exposed aluminum pad. A gold bond wire can be bonded to this aluminum pad. This type of a connection however is highly temperature dependent. At ambient temperatures below about 150 degrees C., the gold of the bond wire will not chemically interact with the aluminum of the pad making the physical attachment and the electrical connection between the gold wire and the aluminum pad sufficiently reliable. At higher temperatures however, above about 150 degrees C., gold starts to interact with the aluminum as a consequence of which the bond rapidly deteriorates. As a result, porosity, delamination and voiding occur within the bond. These effects become more pronounced with the aging of the bond and will eventually result in bond failure. Potential reliability problems therefore prevent using the aluminum bond pad under conditions where the ambient temperature is known to be in excess of 150 degrees C. Furthermore, even when the ambient temperature is less than approximately 150 degrees C., the aluminum bond pad is susceptible to corrosion simply because it is exposed.

Aluminum grows a passivating oxide layer in air and is as a consequence protected against corrosion. Aluminum wiring used in semiconductors, however, contains copper, which does not have a passivating oxide, and the Al—Cu alloy used is more vulnerable to corrosion. The corrosion of aluminum wires is caused by several sources such as chlorine transported through the plastic packaging and the passivation materials, chlorine from the etching compounds and as etching by-products, phosphorous acid formed from excess phosphorous in the phosphosilicate glass, etc. Only a small amount of chlorine is required to cause severe local corrosion of the aluminum lines. Aluminum corrosion can, in addition, occur very quickly after metal etching.

To avoid etching introduced corrosion, chlorine compounds and elemental chlorine must be removed from the metal surface immediately after plasma etching. A water rinse or a water vapor treatment usually accomplishes this.

Modern metal structures use multi-levels of dissimilar materials such as Ti/TiN/Al—Cu/TiN or Ti/Al—Cu/TiN, which increases the possibility of electromechanical corrosion.

Copper is electro-positive with respect to hydrogen and is not vulnerable to corrosion. However, in air copper oxide grows linearly with time, indicating the lack of a protective oxide. This lack of a passivating oxide makes copper more vulnerable to chemical corrosion. To avoid or minimize this corrosion, most applications of copper metalization involve some protective layer deposited on top of the copper.

Materials that are used for bond pads include metallic materials such as tungsten and aluminum while heavily doped polysilicon can also be used for contacting material. The bond pad is formed on the top surface of the semiconductor device whereby the electrically conducting material is frequently embedded in an insulating layer of dielectric. In using polysilicon as the bond pad material, polysilicon can be doped with an n-type dopant for contacting N-regions while it can be doped with p-type dopant for contacting P-regions. This approach; of doping avoids inter-diffusion of the dopants and dopant migration. It is clear that low contact resistance for the bond pad area is required while concerns of avoidance of moisture or chemical solvent absorption, thin film adhesion characteristics, delamination and cracking play an important part in the creation of bond pads.

Methods have been proposed for creating bond caps that require capping of the layer of metal. A barrier layer is thereby deposited over the layer of metal, the barrier layer is patterned after which the barrier layer and the layer of metal are etched. The metal layer is thereby selectively exposed, the bond pad is formed over the barrier layer typically using electrolysis technology.

The conventional processing sequence that is used to create an aluminum pad has been detailed in FIGS. 1a through 1m. No processing conditions or materials that are used for the following sequence will be highlighted since these processing conditions and materials all fall within the scope of the present art.

The process starts with a semiconductor surface 10, FIG. 1a, typically the surface of a silicon single crystalline substrate, in which a copper electrical contact point 12 has been provided. This contact point can be a point of interconnect with a network of metal lines or it can be a contact point or a point to which a via needs to be established. Point 12 can also be an alignment mark that is typically used to position wafers inside semiconductor processing tools. A passivation layer 14 is deposited over the surface 10, FIG. 1b, an opening overlying the contact point 12 is first created in the passivation layer. For this purpose, a first layer 16 of photoresist, FIG. 1c, is deposited over the passivation layer 14 and exposed using mask 18. The exposure to the light source 20 makes the photoresist soluble in the area where the light impacts the photoresist, the photoresist can therefore readily be removed over the area of light impact. FIG. 1d shows a cross section after the exposed first photoresist has been removed and the exposed underlying layer 14 of passivation has been etched in accordance with the opening that has been created in the first layer 16 of photoresist. The patterned first layer 16 of photoresist can now be removed resulting in the cross section that is shown in FIG. 1e. The aluminum from which the aluminum pad will be created is next deposited, layer 22, FIG. 1f. The aluminum layer needs to be patterned, a second layer 24 of photoresist is therefore deposited over the layer 22 of aluminum, FIG. 1g. This second layer 24 of photoresist is exposed by light source 28 via mask 26, FIG. 1h. The non-exposed second photoresist is removed leaving a layer 24, FIG. 1j, of second photoresist in place above the layer of aluminum whereby this second photoresist is aligned with the contact point 12. The layer 22 can now be etched, FIG. 1k, leaving the layer 24 in place above the contact point 12. Remains the removal of the patterned second layer of photoresist, FIG. 1m, which completes the creation of the aluminum pad 22 overlying the contact point 12.

The process of creating an aluminum pad as shown under FIG. 1, has several significant drawbacks, as follows:

the procedure of FIGS. 1a through 1m requires successive alignments of the various etches and exposures to assure that these etches and exposures align with the contact point 12. That is the exposure of the first layer of photoresist and the exposure of the second photoresist must be aligned with the contact point 12, and the final aluminum etch typically includes a wet etch strip, this wet strip causes pitting to occur in the surface of the created aluminum pad.

The invention provides a method of creating aluminum pads that does not have the disadvantages of the current procedure to create such pads.

U.S. Pat. No. 5,785,236 (Cheung et al.) shows an Al pad process.

U.S. Pat. No. 5,696,406 (Ueno) teaches Al pad and damascene process where the passivation layer is normal thickness U.S. Pat. No. 5,939,790 (Gregoire et al.) shows an Al pad structure.

U.S. Pat. No. 5,663,086 (Rostoker et al.) teaches an Al interconnect layer 740 with dimple shape.

SUMMARY OF THE INVENTION

A principle objective of the invention is to provide a method of creating aluminum pads whereby the pad surface is free of imperfections.

Another objective of the invention is to provide a method of creating aluminum pads that is simple and that requires fewer and simpler processing steps than are presently used for the creation of aluminum pads.

Yet another objective of the invention is to provide a method that allows for the creation of aluminum pads that have uniform pad thickness thereby improving pad performance.

A still further objective of the invention is to provide a method of creating aluminum pads whereby the pads surface is not planarized by conventional methods of planarization thereby providing an aluminum pad surface that offers good adhesion.

In accordance with the objectives of the invention a new method is provided to create aluminum pads that overlay an electrical contact point. A thick layer of passivation is deposited over the surface that contains one or more electrical contact points, the layer of passivation is patterned thereby creating openings in the layer of passivation that overlay and align with one or more of the contact points. A layer of aluminum is sputter deposited over the passivation layer including the openings that has been created in the passivation layer, this layer of aluminum is sputtered to a thickness such that the surface of the aluminum that is created in the openings in the layer of passivation is lower than the surface of the layer of passivation. The deposited layer of aluminum is polished using methods of CMP whereby the polishing end point is the surface of the layer of passivation. The surface of the aluminum that has been deposited inside the openings that have been created in the passivation layer is not affected by this polishing operation and therefore maintains its characteristics that have been established during the deposition of the layer of aluminum. This surface therefore is not affected by any chemical processes of etching and wet stripping and therefore contains its original and desirable bond and adhesion qualities.

BRIEF DESCRIPTION OF THE DRAWINGS

FIGS. 1a through 1m show a sequence of processing steps that are followed in creating an aluminum pad following conventional processing, as follows:

FIG. 1a shows a cross section of a semiconductor surface that contains a point of electrical contact FIG. 1b shows a cross section after a layer of passivation has been deposited FIG. 1c shows a cross section after a first layer of photoresist has been deposited, the layer of photoresist is being exposed by a light source FIG. 1d shows a cross section after the exposed photoresist has been removed and the layer of passivation has been etched in accordance with the pattern that has been created in the layer of photoresist FIG. 1e shows a cross section after the first layer of patterned photoresist has been removed FIG. 1f shows a cross section after a layer of aluminum has been sputtered over the surface of the passivation layer including the opening that has been created in the passivation layer FIG. 1g shows a cross section after a second layer of photoresist has been deposited over the surface of the layer of aluminum FIG. 1h shows a cross section while the second layer of photoresist is being exposed by a light source FIG. 1j shows a cross section after the non-exposed second photoresist has been removed FIG. 1h shows a cross section after the layer of aluminum has been etched FIG. 1m shows a cross section after the patterned second layer of photoresist has been removed.

FIG. 2a shows a cross section after the layer of passivation has been deposited and patterned thereby forming an opening above and aligned with the electrical contact point.

FIG. 2b shows a cross section after a layer of aluminum has been deposited over the surface of the layer of passivation thereby including the opening that has been created in the layer of passivation.

FIG. 2c shows a cross section after the deposited layer of aluminum has been polished thereby creating an aluminum pad.

DESCRIPTION OF THE PREFERRED EMBODIMENTS

Figure 2A:
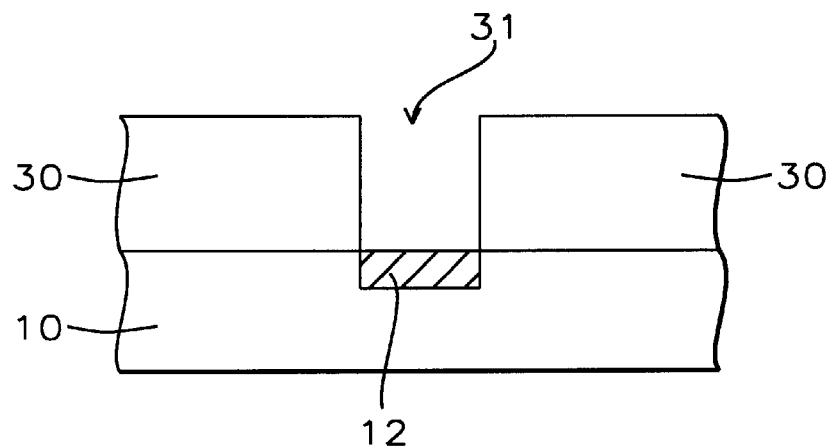
FIGS. 2a through 2c show the processing flow of the invention to form an aluminum pad, as indicated below. It is thereby assumed that the sequence of cross sections that have been shown under FIG. 1a through and including FIG. 1e are part of the processing flow of the process of the invention.

Referring now specifically to FIG. 2a, there is shown a cross section of a surface 10 over which a layer 30 of passivation has been deposited. The passivation layer 30 has been patterned and etched creating an opening 31 in the layer of passivation that overlays and aligns with the exposed copper contact point 12.

Various materials have found application in the creation of passivation layers. A passivation layer can contain silicon oxide/silicon nitride ($SiO_2/Si_3N_4$) deposited by CVD, a passivation layer can be a photosensitive polyimide or can comprise titanium nitride. Another material often used for a passivation layer is phosphorous doped silicon dioxide that is typically deposited over a final layer of aluminum interconnect using a Low Temperature CVD process. In recent years, photosensitive polyimide has frequently been used for the creation of passivation layers. Conventional polyimides have a number of attractive characteristics for their application in a semiconductor device structure such as the ability to fill openings of high aspect ratio, a relatively low dielectric constant (about 3.2), a simple process required for the depositing of a layer of polyimide, the reduction of sharp features or steps in the underlying layer, high temperature tolerance of cured polyimide. Photosensitive polyimides have these same characteristics but can, in addition, be patterned like a photoresist mask and can, after patterning and etching, remain on the surface on which it has been deposited to serve as a passivation layer.

A passivation layer can be deposited using PECVD technology at a temperature between about 350 and 450 degrees C. with a pressure of between about 2.0 and 2.8 Torr for the duration between about 8 and 12 seconds.

Typical passivation etching uses $Ar/CF_4$ as an etchant at a temperature of between about 120 and 160 degrees C. and a pressure of between about 0.30 and 0.40 Torr for a time of between about 33 and 39 seconds using a dry etch process.

Other passivation etching use $He/NF_3$ as an etchant at a temperature of between about 80 and 100 degrees C. and a pressure of between about 1.20 and 1.30 Torr for a time of between about 20 and 30 seconds using a dry etch process.

The passivation layer 30 of the invention is deposited using PECVD technology at a temperature between about 350 and 450 degrees C. with a pressure of between about 2.0 and 2.8 Torr for the duration between about 8 and 12 seconds deposited to a thickness that is between about 2000 and 6000 Angstrom thicker than the height of the to be created aluminum pad.

Figure 2B:
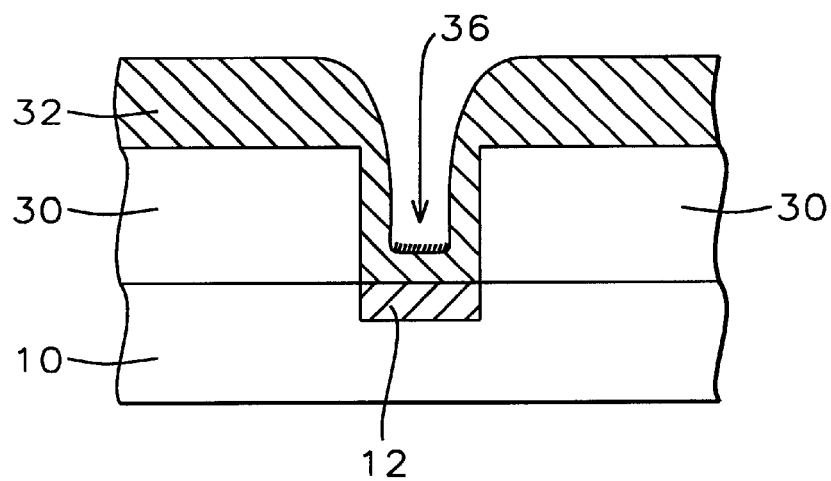

FIG. 2b shows a cross section after a thick layer 32 of aluminum has been sputter deposited over the surface of the layer 30 of passivation thereby including the opening 31 that has been created in this layer 30 of passivation.

The process of the invention deposits the layer 32 of aluminum using conventional methods of metal rf sputtering at a temperature between about 100 and 400 degrees C. and a pressure between about 1 and 100 mTorr using as source aluminum material at a flow rate of between about 10 and 400 sccm to a thickness between about 4000 and 11000 Angstrom. End point for the sputtering process is where the surface of the sputtered aluminum within the opening 31 that has been created in the layer of passivation remains below the surface of that layer 30 of passivation. The surface within the contours of the opening in the layer of passivation remains concave and deflects away from the source of sputtering. It must be noted that the surface region 36 of FIG. 2b is the surface region that has been created during the sputtering of the layer 32 of aluminum and is therefore the surface region that has good surface characteristics as far as adhesion (bonding) of interconnect lines to this surface is concerned. It must also be noted that this surface 36 is lower than the surface of the deposited layer 30 of aluminum so that polishing of this layer 30 of aluminum using CMP does not affect region 36.

Different methods of depositing a layer of low resistivity metal such as aluminum and its alloys have been widely explored for the creation of fine Line interconnects in semiconductor manufacturing. Such metal as $Al_NCu_y$ is an example of fine line interconnect metals. Due to the continued scaling down of line width dimensions in very large scale integrated (VLSI) circuitry manufacturing, problems of reliability have occurred including problems of inadequate isolation, electromigration, and planarization. A key problem is filling high aspect ratio vias and lines without voids or seams and creating homogeneous structures. Furthermore, high temperature bias sputtering (i.e. above 450 degrees C.) technique has been attempted but this technique has limitations below 1 $\mu$m geometries. Conventional techniques such as chemical vapor deposition (CVD) or plating appear promising but as yet have not been applied to the fabrication of such structures. Currently, there is no method which allows the use of Physical Vapor deposition (PVD) techniques or which improves the quality of CVD or plating films if required for filling high aspect ratio vias and lines.

Figure 2C:
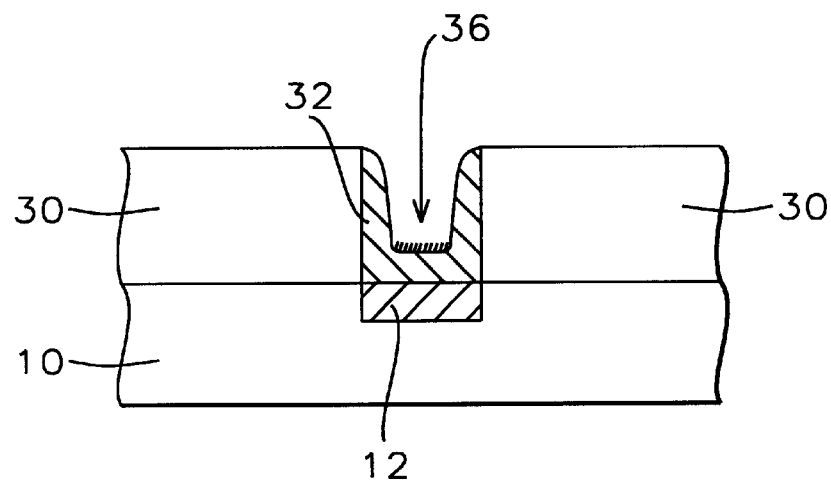

FIG. 2c shows a cross section after the deposited layer 32 of aluminum has been polished using methods of Chemical Mechanical Polishing (CMP). During a typical CMP process, semiconductor wafers are mounted on a polishing fixture such that the wafers are pressed against a polishing pad under pressure. The fixture rotates and moves the wafers relative to the polishing pad. A polishing slurry that contains pH-balanced chemicals, such as sodium hydroxide and silicon dioxide particles is introduced that assists in the actual polishing of the wafers. Polishing pads that are used for the CMP process are typically made from a synthetic fabric. Abrasive actions are created by the motion of the wafer against the polishing pad while the pH of the polishing slurry controls the chemical reactions. Polishing action is controlled by a number of parameters such as the rotational speed with which the polishing pad passes over the surface that is being polished, the chemical composition of the polishing slurry and its abrasive action and the hardness of the polishing pads that are used for the polishing operation. The hardness of pads can be measured by the shore-D hardness number for the pads, for instance 35. The preferred pH value for the polishing slurry that is being applied for the process of the invention is between 2 and 10, the preferred polishing rate is between about 3000 and 8000 Angstrom/minute.

Polishing pads that are used for CMP are typically fabricated from a polyurethane and/or polyester base material. Pads can for instance be specified as being made of a microporous blown polyurethane material having a planar surface and a Shore D hardness of greater than 35 (a hard pad). Other materials used for polishing pads are foam polyurethane, sueded foam polyurathene, unwoven fabric and resin-impregnated unwoven fabric. Semiconductor polishing pads are commercially available such as models IC1000 or Scuba IV of a woven polyurethane material.

The preferred polishing pad of the invention that is to be used for the polishing of the excess aluminum from the surface of the layer of passivation is a hard pad with a Shore D hardness of greater than 35.

Although the invention has been described and illustrated with reference to specific illustrative embodiments thereof, it is not intended that the invention be limited to those illustrative embodiments. Those skilled in the art will recognize that variations and modifications can be made without departing from the spirit of the invention. It is therefore intended to include within the invention all such variations and modifications which fall within the scope of the appended claims and equivalents thereof.

What is claimed is:

1. A method for forming an aluminum pad for copper line interconnect, comprising the steps of:

providing a semiconductor substrate, the surface of said substrate having been provided with one or more copper electrical contact points, a layer of passivation having a thickness having been deposited over the surface of said substrate, the thickness of said layer of passivation exceeding a thickness of said aluminum pads but no less than between about 2000 and 6000 Angstrom, openings having been created in said passivation layer that align with one or more of said electrical contact points provided in the surface of said substrate;

rf sputter depositing a layer of aluminum over the surface of said layer of passivation, including said openings created in said layer of passivation; and polishing said layer of aluminum.

2. The method of claim 1 wherein said rf sputter depositing a layer of aluminum is depositing a layer of aluminum to a thickness such that a rf sputter end point is reached at a time that the surface of the aluminum that is deposited inside said openings that have been provided in said layer of passivation is lower than the surface of said layer of passivation by a measurable amount.

3. The method of claim 1, said rf sputter depositing a layer of aluminum being rf sputtering at a temperature between about 100 and 400 degrees C. and a pressure between about 1 and 100 mTorr using as source aluminum material, said layer of aluminum being deposited to a thickness between about 4000 and 11000 Angstrom.

4. The method of claim 1 wherein said polishing said layer of aluminum is removing said aluminum from the surface of said layer of passivation thereby furthermore leaving said sputtered aluminum in place inside said openings within said layer of passivation.

5. The method of claim 1 whereby said polishing said layer of aluminum uses Chemical Mechanical Polishing techniques whereby a polishing pad is used that has a shore-D hardness number of no less than 35.

6. A method for forming an aluminum pad having a required thickness for copper line interconnect, comprising the steps of:

providing a semiconductor substrate, said substrate having been provided with a multiplicity of active devices, copper electrical points of contact having been provided in the surface of said substrate;

depositing a layer of passivation having a thickness over the surface of said substrate, the thickness of said layer of passivation exceeding a required thickness of said aluminum pads but no less than between about 2000 and 6000 Angstrom;

patterning and etching said layer of passivation creating openings in said layer of passivation that align with one or more of said points of electrical contact in the surface of said substrate;

rf sputter depositing a layer of aluminum over the surface of said layer of passivation, including said openings etched in said layer of passivation, said rf sputter depositing having a rf sputter endpoint; and polishing the surface of said layer of rf sputter deposited aluminum.

7. The method of claim 6 wherein said rf sputter depositing a layer of aluminum is depositing a layer of aluminum to a thickness such that the rf sputter end point is reached at a time that the surface of the aluminum that is deposited inside said openings that have been provided in said layer of passivation is lower than the surface of said layer of passivation by a measurable amount.

8. The method of claim 6 wherein said rf sputter depositing a layer of aluminum is rf sputtering at a temperature between about 100 and 400 degrees C. and a pressure between about 1 and 100 mTorr using as source aluminum material, said layer of aluminum being deposited to a thickness between about 4000 and 11000 Angstrom.

9. The method of claim 6 wherein said polishing said layer of aluminum is removing said aluminum from the surface of said layer of passivation, leaving said sputtered aluminum in place inside said openings within said layer of passivation.

10. The method of claim 6, said polishing said layer of aluminum using Chemical Mechanical Polishing techniques whereby a polishing pad is used having a shore-D hardness number of no less than 35.

* * * * *